US010361225B2

(12) United States Patent
Lu et al.

(10) Patent No.: US 10,361,225 B2
(45) Date of Patent: Jul. 23, 2019

(54) ACTIVE DEVICE ARRAY STRUCTURE

(71) Applicant: E Ink Holdings Inc., Hsinchu (TW)

(72) Inventors: Chun-Yu Lu, Hsinchu (TW);
Kuo-Hsing Cheng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/968,722

(22) Filed: May 1, 2018

(65) Prior Publication Data
US 2018/0323219 A1 Nov. 8, 2018

(30) Foreign Application Priority Data

May 5, 2017 (CN) .......................... 2017 1 0310718

(51) Int. Cl.
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136259* (2013.01); *G02F 1/136286* (2013.01); *G02F 1/1368* (2013.01); *G02F 2001/136272* (2013.01)

(58) Field of Classification Search
CPC . H01L 27/124; H01L 27/1024; H01L 27/156; H01L 27/2481
See application file for complete search history.

(56) References Cited

U.S. PATENT DOCUMENTS

| | | | |
|---|---|---|---|
| 5,729,309 A | 3/1998 | Na et al. | |
| 7,209,193 B2 | 4/2007 | Song et al. | |
| 8,081,282 B2 | 12/2011 | Lee et al. | |
| 8,754,999 B2 | 6/2014 | Lee et al. | |
| 8,760,479 B2 | 6/2014 | Shin et al. | |
| 2008/0246908 A1 | 10/2008 | Lee et al. | |
| 2017/0285404 A1* | 10/2017 | Kubota | G02F 1/133555 |

* cited by examiner

*Primary Examiner* — Elias Ullah
(74) *Attorney, Agent, or Firm* — JCIPRNET

(57) ABSTRACT

An active device array structure including a substrate including a first region and a second region, and first signal lines, second signal lines, third signal lines, and active devices disposed on the substrate is provided. A bending degree of the first region is greater than that of the second region. The first signal lines and the second signal lines cross through the first region and the second region. Each first signal line includes a first multi-segments structure located in the first region. Each first multi-segments structure includes first segments connected in parallel. An extending direction of the third signal lines is intersected with the first signal lines and the second signal lines. Each third signal line is electrically connected to one first signal line. The active devices are electrically connected to the second and the third signal lines, or the first and the third signal lines.

13 Claims, 7 Drawing Sheets

ACTIVE DEVICE ARRAY STRUCTURE

CROSS-REFERENCE TO RELATED APPLICATION

This application claims the priority benefit of China application serial no. 201710310718.4, filed on May 5, 2017. The entirety of the above-mentioned patent application is hereby incorporated by reference herein and made a part of this specification.

BACKGROUND OF THE INVENTION

1. Field of the Invention

The invention relates to an active device array structure, and more particularly, to an active device array structure including a bending region.

2. Description of Related Art

With the trend in designing electronic products to be more and more diversified, various display panels having a bending region, such as a curved display or a flexible display, have been developed at present. However, for this type of electronic product, because damages or breakages can often be found at signal lines in the bending region, signal lines are prone to impedance rising, which leads to signal delay or distortion. For instance, in an electronic product having the flexible display, after the signal lines in the bending region are repeatedly folded and unfolded, defects on the signal lines will gradually come into being. Then, the image display function thereof may not be performed normally to affect a display quality of the electronic product. In response to market demands, it is currently required to develop an electronic product capable of overcoming the problem of damages or breakages for the signal lines in the bending region of the display panel.

SUMMARY OF THE INVENTION

The invention is directed to an active device array structure capable of solving the problem of breakages found at the signal lines in the bending region.

An active device array structure of the invention includes a substrate, a plurality of first signal lines, a plurality of second signal lines, a plurality of third signal lines, and a plurality of active devices. The substrate has a first region and a second region, and a bending degree of the first region is greater than that of the second region. The first signal lines are disposed on the substrate. Each of the first signal lines crosses through the first region and the second region and includes at least one first multi-segments structure. The first multi-segments structure is located in the first region and includes a plurality of first segments connected in parallel. The second signal lines are disposed on the substrate. Each of the second signal lines crosses through the first region and the second region and is electrically independent from the first signal lines. The third signal lines are disposed on the substrate. An extending direction of the third signal lines is intersected with the first signal lines and the second signal lines and each of the third signal lines is electrically connected to one of the first signal lines or one of the second signal lines. The active device is disposed on the substrate. When each of the third signal lines is electrically connected to one of the first signal lines, each of the active devices is electrically connected to one of the second signal lines and one of the third signal lines. Alternatively, when each of the third signal lines is electrically connected to one of the second signal lines, each of the active devices is electrically connected to one of the first signal lines and one of the third signal lines.

In an embodiment of the invention, at least a part of the active devices is disposed in the first region, and another part of the active devices is disposed in the second region.

In an embodiment of the invention, the first signal lines transmit a data signal, and the second signal lines transmit a scan signal.

In an embodiment of the invention, the first signal lines transmit a scan signal, and the second signal lines transmit a data signal.

In an embodiment of the invention, each of the first signal lines further includes a single-segment structure, and the single-segment structure and the first multi-segments structure are connected in turn along an extending direction of each of the first signal lines.

In an embodiment of the invention, the first multi-segments structure includes N first segments connected in parallel, a line width of the single-segment structure is N times a line width of one of the N first segments, and N is an integer greater than 1.

In an embodiment of the invention, each of the first signal lines includes a plurality of single-segment structures, and the single-segment structures and the first multi-segments structures are alternately connected along an extending direction of each of the first signal lines.

In an embodiment of the invention, each of the at least one first multi-segments structure is located between adjacent two of the third signal lines.

In an embodiment of the invention, adjacent two of the first segments of each of the at least one first multi-segments structure are separated by an opening.

In an embodiment of the invention, a shape of the opening includes a rectangle or a rhombus.

In an embodiment of the invention, a spacing distance between the adjacent two of the first segments of the first multi-segments structure is 4 μm.

In an embodiment of the invention, an extending direction of the first signal lines is parallel to an extending direction of the second signal lines.

In an embodiment of the invention, when each of the third signal lines is electrically connected to one of the second signal lines, a number of the second signal lines is equal to a number of the third signal lines.

In an embodiment of the invention, when each of the third signal lines is electrically connected to one of the first signal lines, a number of the first signal lines is equal to the number of the third signal lines.

In an embodiment of the invention, at least one of the second signal lines includes at least one second multi-segments structure, and the second multi-segments structure is located in the first region and includes a plurality of second segments connected in parallel.

In an embodiment of the invention, the at least one of the second signal lines further includes at least one single-segment structure, and the single-segment structure and the second multi-segments structure are connected in turn along an extending direction of the at least one second signal line.

In an embodiment of the invention, the second multi-segments structure includes N second segments connected in parallel, a line width of the single-segment structure is N times a line width of one of the N second segments, and N is an integer greater than 1.

In an embodiment of the invention, the first region is adapted to be bent along a bending axis, and an intersection angle between an extending direction of the first signal lines and the second signal lines and the bending axis is greater than an intersection angle between the extending direction of the third signal lines and the bending axis.

In an embodiment of the invention, the first region of the substrate is bendable, and the second region of the substrate is substantially flat.

In an embodiment of the invention, extending directions of the first signal lines and the second signal lines are perpendicular to the bending axis.

Based on the above, in the active device array structure of the invention, the signal lines crossing through the first region include the multi-segments structures located in the first region. By utilizing the design of the multi-segments structures, the signal lines crossing through the first region are not prone to damages caused by bending stress, and thus the problem of non-uniform impedance generated due to damages of the signal lines can be solved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
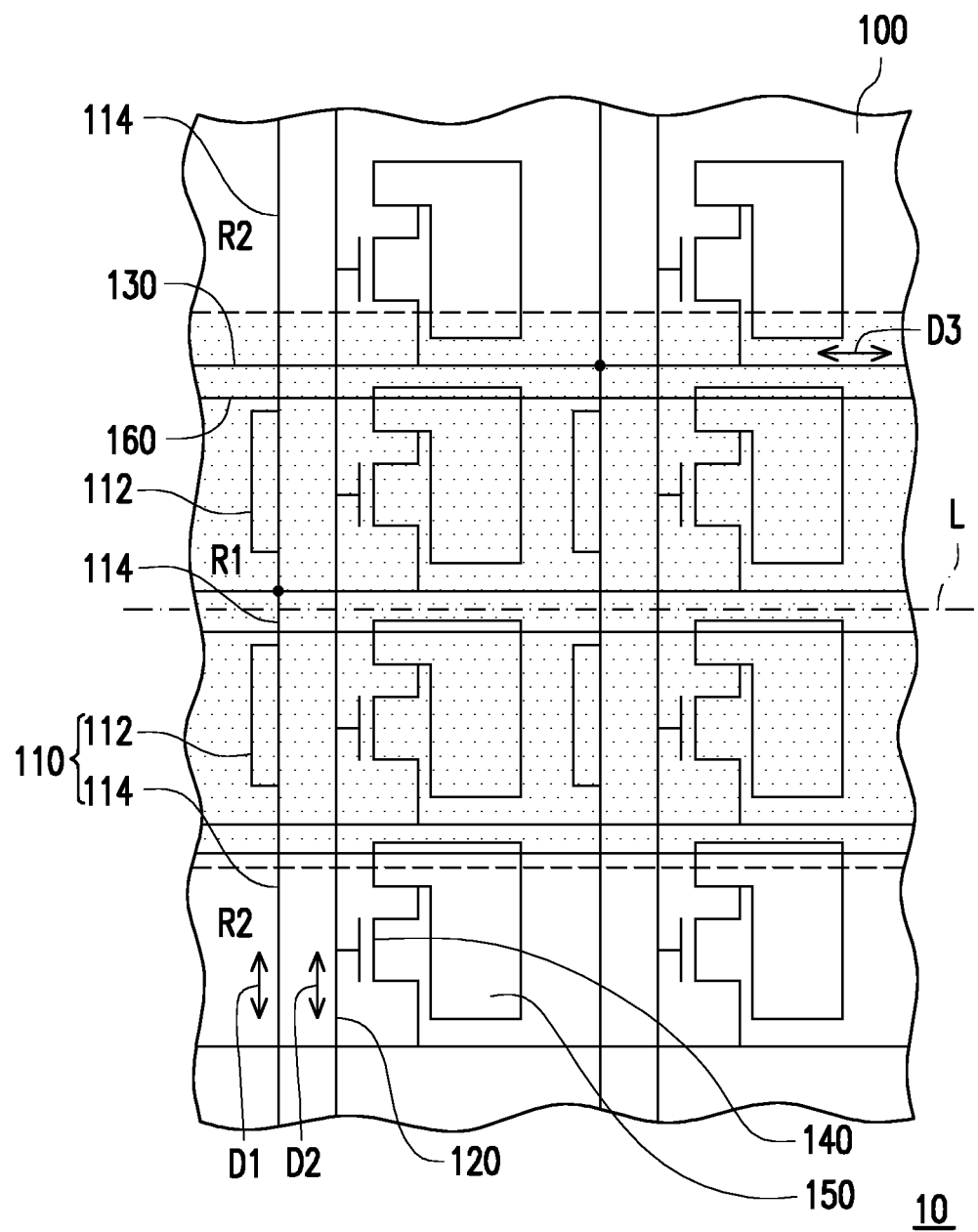
FIG. 1 is a top view of an active device array structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view of an active device array structure according to an embodiment of the invention. With reference to FIG. 1, an active device array structure 10 includes a substrate 100, first signal lines 110, second signal lines 120, third signal lines 130, and active devices 140. The first signal lines 110, the second signal lines 120, the third signal lines 130, and the active devices 140 are all disposed on the substrate 100 to constitute the active device array structure 10. In addition, the active device array structure 10 may further include pixel electrodes 150 and common electrodes 160.

The substrate 100 has a first region R1 and a second region R2, and a bending degree (curvature) of the first region R1 is greater than that of the second region R2. In general, the first region R1 is where the substrate is bent, and the second region R2 is where the substrate is substantially flat. In an embodiment, a material of the substrate 100 is, for example, polyethylene terephthalate (PET), polyethylene naphthalate (PEN), polyester (PES), polymethylmethacrylate (PMMA), polycarbonate (PC), polyimide (PI), metal foils, or other suitable materials.

Taking the present embodiment as an example, the first region R1 is located between two said second regions R2, but the invention is not limited thereto. In other embodiments, the first region R1 may be located at an edge portion of the substrate 100 instead of being limited only to be located between two said second regions R2. In an embodiment, the second region R2 is a region which is not predetermined to be bent, but the invention is not limited thereto. In other embodiments, after the substrate 100 is bent, the second region R2 is also bent except that a bending degree of the second region R2 is smaller than a bending degree of the first region R1. In other words, in the case the substrate 100 is bent, a curvature of the first region R1 is greater than a curvature of the second region R2.

The first signal lines 110 and the second signal lines 120 cross through the first region R1 and the second region R2. The second signal lines 120 are electrically independent from the first signal lines 110. An extending direction D1 of the first signal lines 110 may not be parallel to an extending direction D2 of the second signal lines 120. In addition, an intersection angle between the extending direction D1 of the first signal lines 110 and a bending axis L may be greater than an intersection angle between an extending direction D3 of the third signal lines 130 and the bending axis L, and an intersection angle between the extending direction D2 of the second signal lines 120 and the bending axis L may be greater than the intersection angle between the extending direction D3 of the third signal lines 130 and the bending axis L, but the invention is not limited thereto. In other embodiments, the first signal lines 110 and the second signal lines 120 are substantially parallel, and the extending directions D1 and D2 of the two may both be perpendicular to the bending axis L. Further, the extending direction D3 of the third signal lines 130 may be parallel to the bending axis L.

The first signal line 110 includes a plurality of first multi-segments structures 112 and a plurality of single-segment structures 114. The first multi-segments structure 112 is located in the first region R1. The single-segment structure 114 and the first multi-segments structure 112 are alternately connected along the extending direction D1 of the first signal lines 110. In the present embodiment, the first signal line 110 includes a plurality of single-segment structures 114 and two first multi-segments structures 112, but the invention is not limited thereto. In other embodiments, the first signal line 110 may only include one single-segment structure 114 and one first multi-segments structure 112, and the single-segment structure 114 and the first multi-segments structure 112 are connected in turn along the extending direction D1 of the first signal line 110. In this case, an extended length of the first multi-segments structure 112 can cross through the first region R1. In other embodiments, the first signal line 110 may selectively include two or more single-segment structures 114 and two or more first multi-segments structures 112.

The extending direction D3 of the third signal lines 130 is intersected with the first signal lines 110 and the second signal lines 120 and each of the third signal lines 130 is electrically connected to one of the first signal lines 110. In the present embodiment, each of the first multi-segments structures 112 is located between adjacent two of the third signal lines 130, but the invention is not limited thereto. In other embodiments, the extending length of the first multi-segments structure 112 may cross multiple third signal lines 130. In an embodiment, when the third signal line 130 is electrically connected to one of the first signal lines 110, a number of the first signal lines 110 is equal to a number of the third signal lines 130, but the invention is not limited thereto. In other embodiments, the number of the third signal lines 130 may not be equal to the number of the first signal lines 110.

The active device 140 is electrically connected to one of the second signal lines 120 and one of the third signal lines 130. In the present embodiment, at least part of the active devices 140 is disposed in the first region R1 and another part of the active devices 140 is disposed in the second region R2, but the invention is not limited thereto. In other embodiments, the active devices 140 may be selectively disposed only in the second region R1 or disposed only in the first region R1. In the present embodiment, the active device 140 may be a three-terminal device, such as a transistor. A gate of each of the active devices 140 is electrically connected to one of the second signal lines 120, a source of each of the active devices 140 is electrically connected to one of the third signal lines 130, and a drain of each of the active devices 140 is electrically connected to one of the pixel electrodes 150. However, the invention is not limited to the above. In other embodiments, the source of the active device 140 may selectively be electrically connected to one of the second signal lines 120, whereas the gate of the active device 140 is electrically connected to one of the third signal lines 130. In other words, one of the second signal line 120 and the third signal line 130 is a scan line for transmitting a scan signal, and the other one is a data line for transmitting a data signal.

The pixel electrodes 150 and the common electrodes 160 are disposed on the substrate 100, and the pixel electrodes 150 are electrically connected to the active devices 140. The pixel electrode 150 may be a transmissive pixel electrode, a reflective pixel electrode or a semi-transmissive (trans-reflective) pixel electrode. A material of the transmissive pixel electrode includes a metal oxide such as an indium tin oxide, an indium zinc oxide, an aluminum tin oxide, an aluminum zinc oxide, an indium gallium zinc oxide, or other suitable metal oxides, or a stacked layer of at least two of the above. A material of the reflective pixel electrode includes a metal material with high reflectivity. In an embodiment, the active device array structure 10 further includes a display medium (not illustrated) located on the pixel electrode 150, and the display medium includes a liquid crystal molecule, an electrophoretic display medium, or other applicable media. The common electrode 160 is independent from the pixel electrode 150, and the common electrode 160 applied with a common voltage (Vcom) can be electrically coupled with the pixel electrode 150 to form a storage capacitance. In an embodiment, the common voltage is, for example, a ground voltage, but the invention is not limited thereto.

Based on the above, in the active device array structure 10 of the invention, the first signal line 110 in the first region R1 includes the first multi-segments structures 112. By utilizing the design of the first multi-segments structures 112, the first signal lines 110 in the first region R1 are not prone to be damaged by bending, and thus the problem of non-uniform impedance generated due to damages of the first signal lines 110 can be solved.

Figure 2:
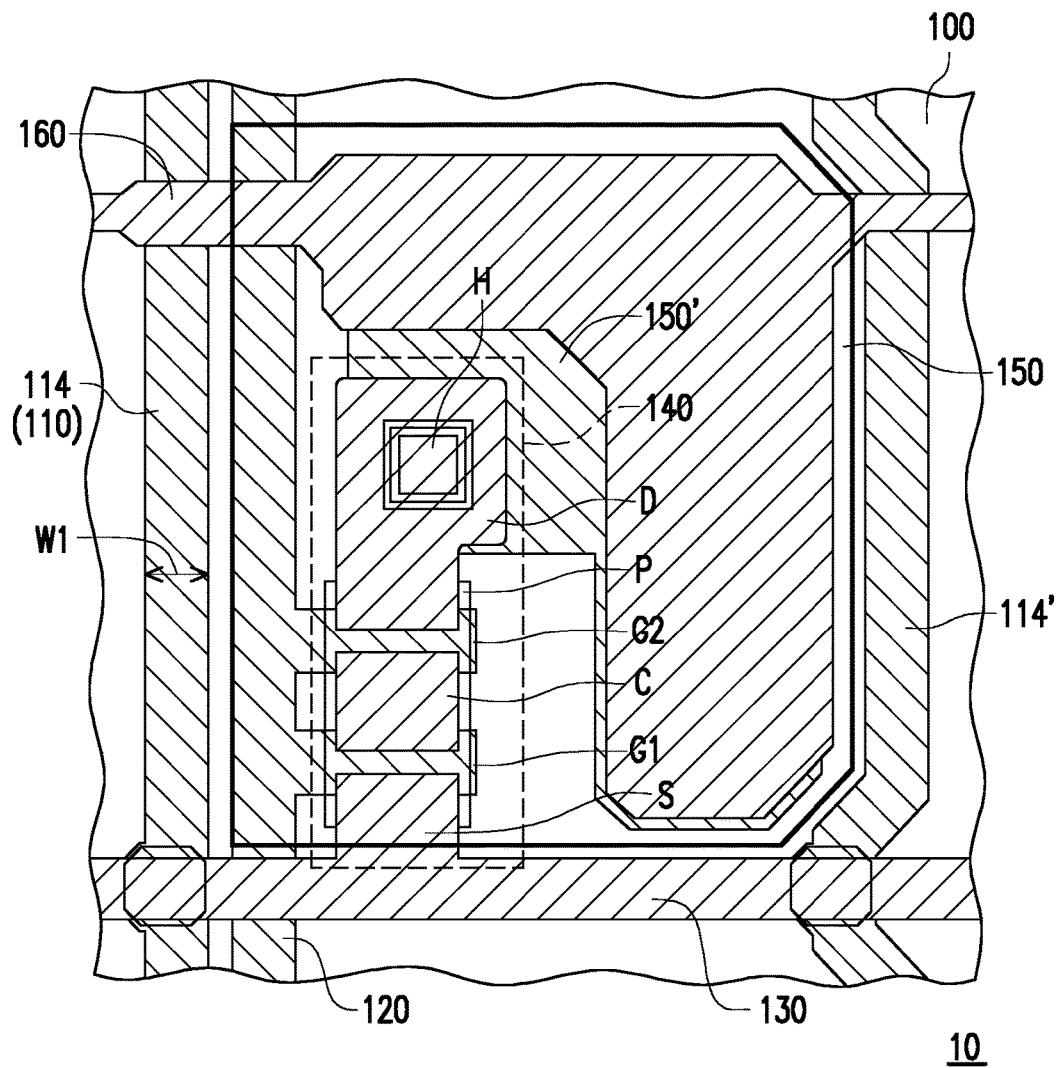
FIG. 2 is a top view of a second region of an active device array structure according to another embodiment of the invention.
Figure 3:
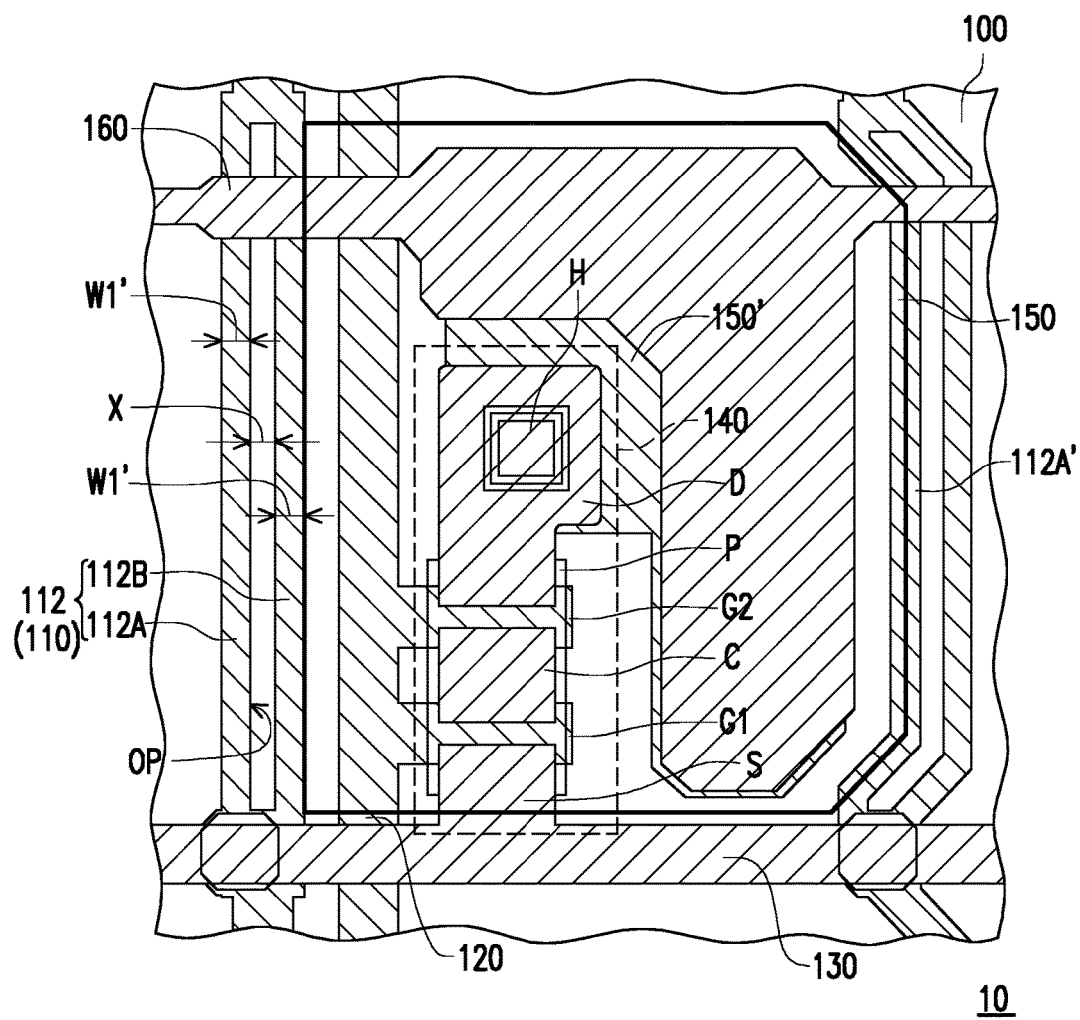
FIG. 3 is a top view of a first region of an active device array structure according to another embodiment of the invention.

FIG. 2 is a top view of a second region of an active device array structure according to another embodiment of the invention. FIG. 2 is, for example, a top view illustrating a portion of the second region R2 of the active device array structure 10 in the embodiment of FIG. 1, and FIG. 2 may also be a top view illustrating a portion of the second region R2 of the active device array structure in other embodiments of the invention. FIG. 3 is a top view of a first region of an active device array structure according to another embodiment of the invention. FIG. 3 is, for example, a top view illustrating a portion of the first region R1 of the active device array structure 10 in the embodiment of FIG. 1, and FIG. 3 may also be a top view illustrating a portion of the first region R1 of the active device array structure in other embodiments of the invention. It should be noted that, the reference numbers and a part of the contents in the previous embodiment are used in the embodiments of FIG. 2 and FIG. 3, in which identical reference numbers indicate identical or similar components, and repeated description of the same technical contents is omitted. The omitted part of the description can refer to the foregoing embodiments, which are repeated in the following embodiments.

With reference to FIG. 2 and FIG. 3, the active device 140 includes a first gate G1, a second gate G2, a drain D, a source S, a connection part C and a semiconductor layer P. The second signal line 120 is electrically connected to the first gate G1 and the second gate G2. The pixel electrode 150 is electrically connected to the drain D through a contact hole H. The third signal line 130 is electrically connected to the source S. The connection part C is located between the drain D and the source S and separated from the drain D and the source S. The connection part C covers a part of the first gate G1 and a part of the second gate G2. In an embodiment, a film layer where the semiconductor layer P is disposed is located between a film layer where the first gate G1 is disposed and a film layer where the source S is disposed, but the invention is not limited thereto. In other embodiments, the film layer where the first gate G1 is disposed is located between the film layer where the semiconductor layer P is disposed and the film layer where the source S is disposed. The active device 140 in the present embodiment is an active device with dual-gate, but the invention is not limited thereto. In other embodiments, the active device 140 may also include only one gate.

In the present embodiment, the active device array structure 10 further includes an auxiliary electrode 150', the common electrode 160 is sandwiched between the auxiliary electrode 150' and the pixel electrode 150, and the auxiliary electrode 150' can be electrically connected to the pixel electrode 150. The pixel electrode 150 and the auxiliary electrode 150' are electrically independent from the common electrode 160. In an embodiment, an insulation layer is sandwiched between the pixel electrode 150 and the common electrode 160 and an insulation layer is also sandwiched between the pixel electrode 150 and the auxiliary electrode 150' such that the pixel electrode 150 and the auxiliary electrode 150' can be electrically coupled to the common electrode 160 to generate the storage capacitance as required.

In the present embodiment, the first signal line 110 includes the first multi-segments structures 112 (as shown in FIG. 3) and the single-segment structures 114 (as shown in FIG. 2). In FIG. 3, the first multi-segments structure 112 is located in the first region R1 and has a first segment 112A and a first segment 112B connected in parallel. The first segment 112A and the first segment 112B of the first multi-segments structure 112 are separated by an opening OP. In the present embodiment, a shape of the opening OP is a rectangle, but the invention is not limited thereto. In other embodiments, the opening OP may be a rhombus or other geometric shapes. A spacing distance X between the first segment 112A and the first segment 112B of the first multi-segments structure 112 is, most preferably, a minimum line width of process capability (e.g., approximately 4 µm in the present embodiment), which may also be adjusted based on actual requirements and the invention is not limited thereto. In the present embodiment, the first multi-segments structure 112 is formed by two first segments connected in parallel and a line width W1 of the single-segment structure 114 in FIG. 2 is twice a line width W1' of at least one of the first segment 112A and the first segment 112B, but the invention is not limited thereto. In other embodiments, when the first multi-segments structure 112 includes N first segments connected in parallel, the line width W1 of the single-segment structure 114 is N times the line width W1' of one of the N first segments, and N is an integer greater than 1. In certain embodiments, a total line width of the first multi-segments structure 112 may be equal to a total line width of the single-segment structure 114.

In the present embodiment, with reference to FIG. 1 to FIG. 3, the first signal line 110, the second signal line 120 and the auxiliary electrode 150' are located in the same film layer (e.g., a first conductive layer), and the third signal line 130 and the common electrode 160 are also located in the same film layer (e.g., a second conductive layer). To maintain electrical independence for each component, a specific spacing distance needs to be kept between adjacent electrical components. For instance, in FIG. 2, one specific spacing distance needs to be kept between the single-segment structure 114 and the adjacent second signal line 120 on one side of the pixel electrode 150, and one specific spacing distance also needs to be kept between another single-segment structure 114' and the common electrode 160 on the opposite side of the pixel electrode 150. Similarly, in FIG. 3, one specific spacing distance needs to be kept between the first segment 112B of the first multi-segments structure 112 and the adjacent second signal line 120 and one specific spacing distance needs to be kept between the first segment 112A and the first segment 112B on one side of the pixel electrode 150, and one specific spacing distance also needs to be kept between another first segment 112A' and the common electrode 160 on the opposite side of the pixel electrode 150. In an embodiment, an area of the common electrode 160 located in the first region R1 (as shown in FIG. 3) may be less than an area of the common electrode 160 located in the second region R2 (as shown in FIG. 2). In this way, the storage capacitance may be reduced, but the first signal lines 110 can have the same pitch in both the first region R1 and the second region R2 without increasing a RC loading of the line itself.

Figure 4:
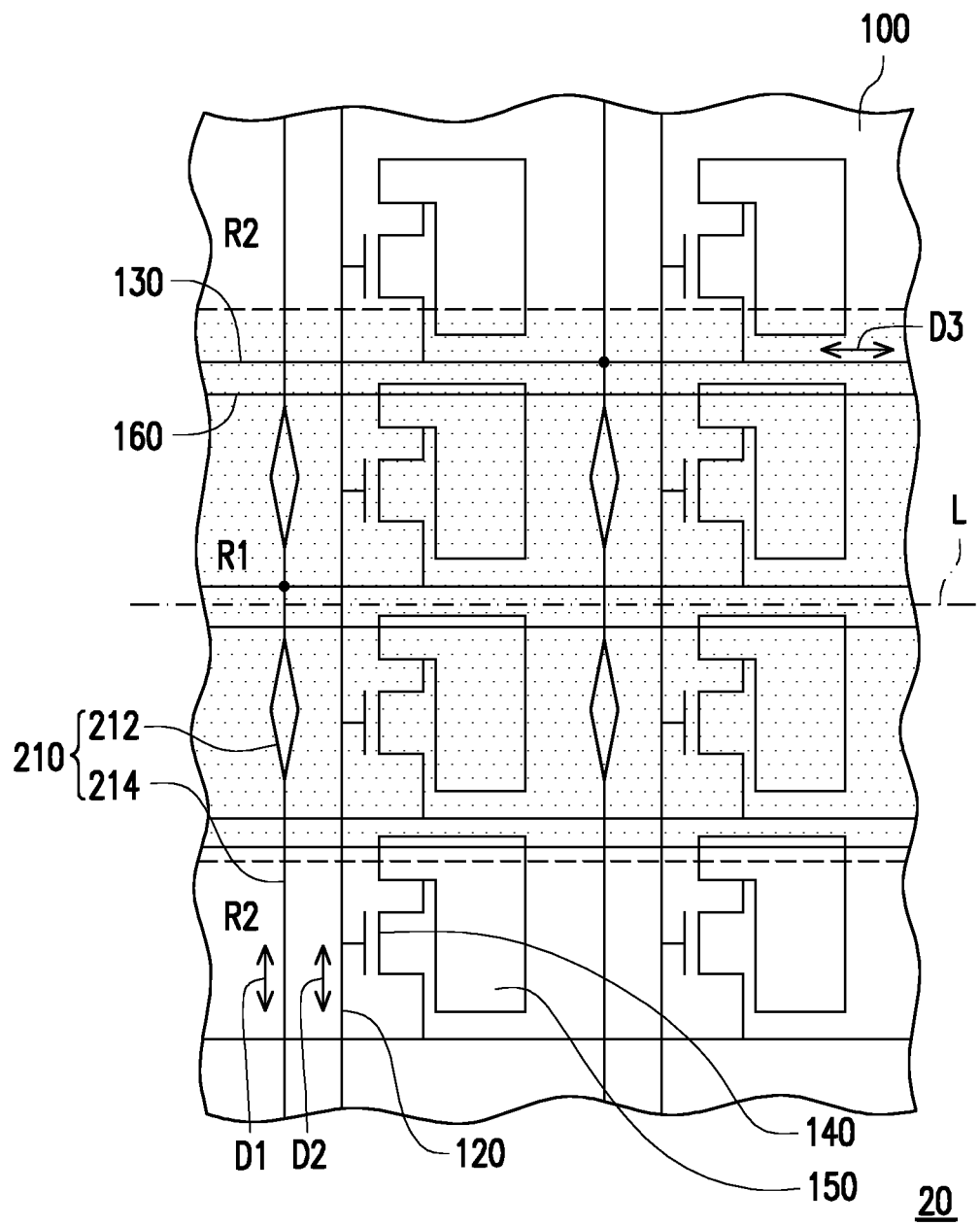
FIG. 4 is a top view of an active device array structure according to yet another embodiment of the invention.

FIG. 4 is a top view of an active device array structure 20 according to yet another embodiment of the invention. It should be noted that, the reference numbers and a part of the contents in the previous embodiment are used in the embodiment of FIG. 4, in which identical reference numbers indicate identical or similar components, and repeated description of the same technical contents is omitted. The omitted part of the description can refer to the foregoing embodiments, which are repeated in the following embodiments.

The difference between the active device array structure 20 of FIG. 4 and the active device array structure 10 of FIG. 1 is that, first signal lines 210 in the active device array structure 20 of FIG. 4 have a structural design different from that of the first signal lines 110 in the active device array structure 10 of FIG. 1.

With reference to FIG. 4, the first signal lines 210 are disposed on the substrate 100. The first signal line 210 crosses through the first region R1 and the second region R2. The first signal line 210 includes a plurality of first multi-segments structures 212 and a plurality of single-segment structures 214. The first multi-segments structure 212 is located in the first region R1. The single-segment structure 214 and the first multi-segments structure 212 are alternately connected along the extending direction D1 of the first signal lines 210. In the present embodiment, a first multi-segments structure 212 of the first signal line 210 includes an opening in shape of a rhombus.

Based on the above, in the active device array structure 20 of the invention, the first signal line 210 located in the first region R1 includes the first multi-segments structures 212. By utilizing the design of the first multi-segments structures 212, the first signal lines 210 in the first region R1 are not prone to be damaged by bending, and thus the problem of non-uniform impedance generated due to damages of the first signal lines 210 can be solved.

Figure 5:
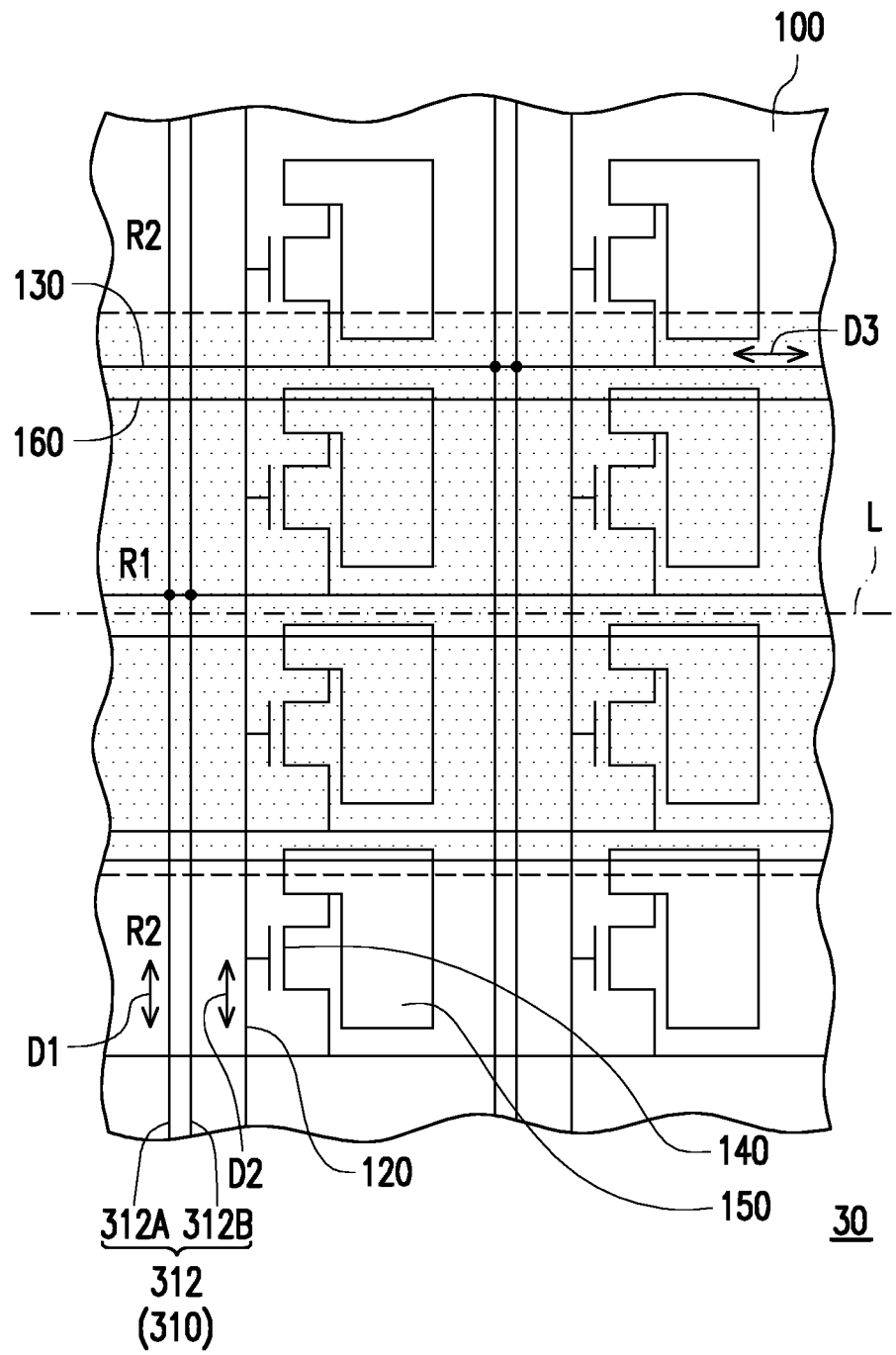
FIG. 5 is a top view of an active device array structure according to, again, another embodiment of the invention.

FIG. 5 is a top view of an active device array structure 30 according to, again, another embodiment of the invention. It should be noted that, the reference numbers and a part of the contents in the previous embodiment are used in the embodiment of FIG. 5, in which identical reference numbers indicate identical or similar components, and repeated description of the same technical contents is omitted. The omitted part of the description can refer to the foregoing embodiments, which are repeated in the following embodiments.

The difference between the active device array structure 30 of FIG. 5 and the active device array structure 10 of FIG. 1 is that, first signal lines 310 in the active device array structure 30 of FIG. 5 are different from the first signal lines 110 in the active device array structure 10 of FIG. 1.

With reference to FIG. 5, the first signal lines 310 are disposed on the substrate. The first signal line 310 crosses through the first region R1 and the second region R2. The first signal line 310 includes a first multi-segments structure 312 composed of a first segment 312A and a first segment 312B. The first segment 312A and the first segment 312B are connected in parallel, and are spaced apart from each other by a pitch. In the present embodiment, the first signal line 310 is composed of two first segments connected in parallel, but the invention is not limited thereto. In other embodiments, the first signal line 310 is composed of three or more first segments connected in parallel.

Based on the above, in the active device array structure 30 of the invention, the first signal line 310 located in the first region R1 includes the first multi-segments structures 312. By utilizing the design of the first multi-segments structures 312, the first signal lines 310 in the first region R1 are not prone to be damaged by bending, and thus the problem of non-uniform impedance generated due to damages of the first signal lines 310 can be solved.

Figure 6:
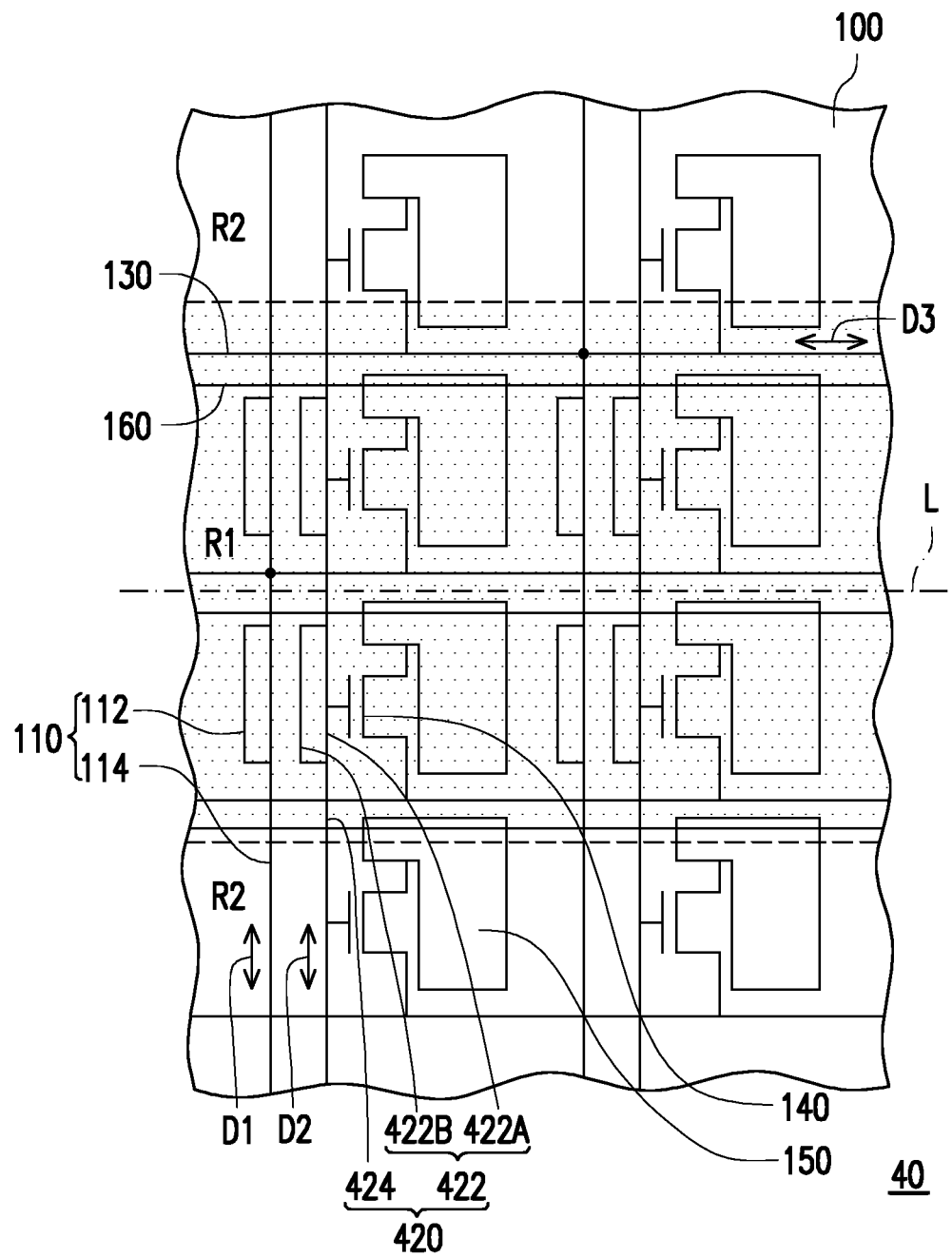
FIG. 6 is a top view of an active device array structure according to, again, yet another embodiment of the invention.

FIG. 6 is a top view of an active device array structure 40 according to, again, yet another embodiment of the invention. It should be noted that, the reference numbers and a part of the contents in the previous embodiment are used in the embodiment of FIG. 6, in which identical reference numbers indicate identical or similar components, and repeated description of the same technical contents is omitted. The omitted part of the description can refer to the foregoing embodiments, which are repeated in the following embodiments.

The difference between the active device array structure 40 of FIG. 6 and the active device array structure 10 of FIG. 1 is that, second signal lines 420 in the active device array structure 40 of FIG. 6 are different from the second signal lines 120 in the active device array structure 10 of FIG. 1.

With reference to FIG. 6, the second signal lines 420 are disposed on the substrate 100. The second signal line 420 crosses through the first region R1 and the second region R2, and the second signal line 420 includes a plurality of second multi-segments structures 422 and a plurality of single-segment structures 424. The second multi-segments structure 422 is located in the first region R1. The second multi-segments structure 422 includes a plurality of second segments 422A and 422B connected in parallel. The single-segment structure 424 and the second multi-segments structure 422 are alternately connected along the extending direction D1 of the second signal lines 420. The signal lines 420 are electrically independent from the first signal lines 110. In the present embodiment, the second signal line 420 includes a plurality of single-segment structures 424 and two second multi-segments structures 422, but the invention is not limited thereto. In other embodiments, the second signal line 420 includes only one single-segment structure 424 and one second multi-segments structure 422, and the single-segment structure 424 and the second multi-segments structure 422 are sequentially connected along the extending direction D2 of the second signal lines 420. In other embodiments, the second signal line 420 may include two or more single-segment structures 424 and two or more second multi-segments structures 422. In other embodiments, the second multi-segments structure 422 includes N second segments connected in parallel, and a line width of the single-segment structure 424 is N times a line width of one of the N second segments, and N is an integer greater than 1.

Based on the above, in the active device array structure 40 of the invention, the first signal line 110 located in the first region R1 includes the first multi-segments structures 112 and the second signal line 420 includes the second multi-segments structures 422. By utilizing the design of the first multi-segments structures 112 and the second multi-segments structures 422, the first signal lines 110 and the second signal lines 420 in the first region R1 are not prone to be damaged by bending, and thus the problem of non-uniform impedance generated due to damages of the first signal lines 110 and the second signal lines 420 can be solved.

Figure 7:
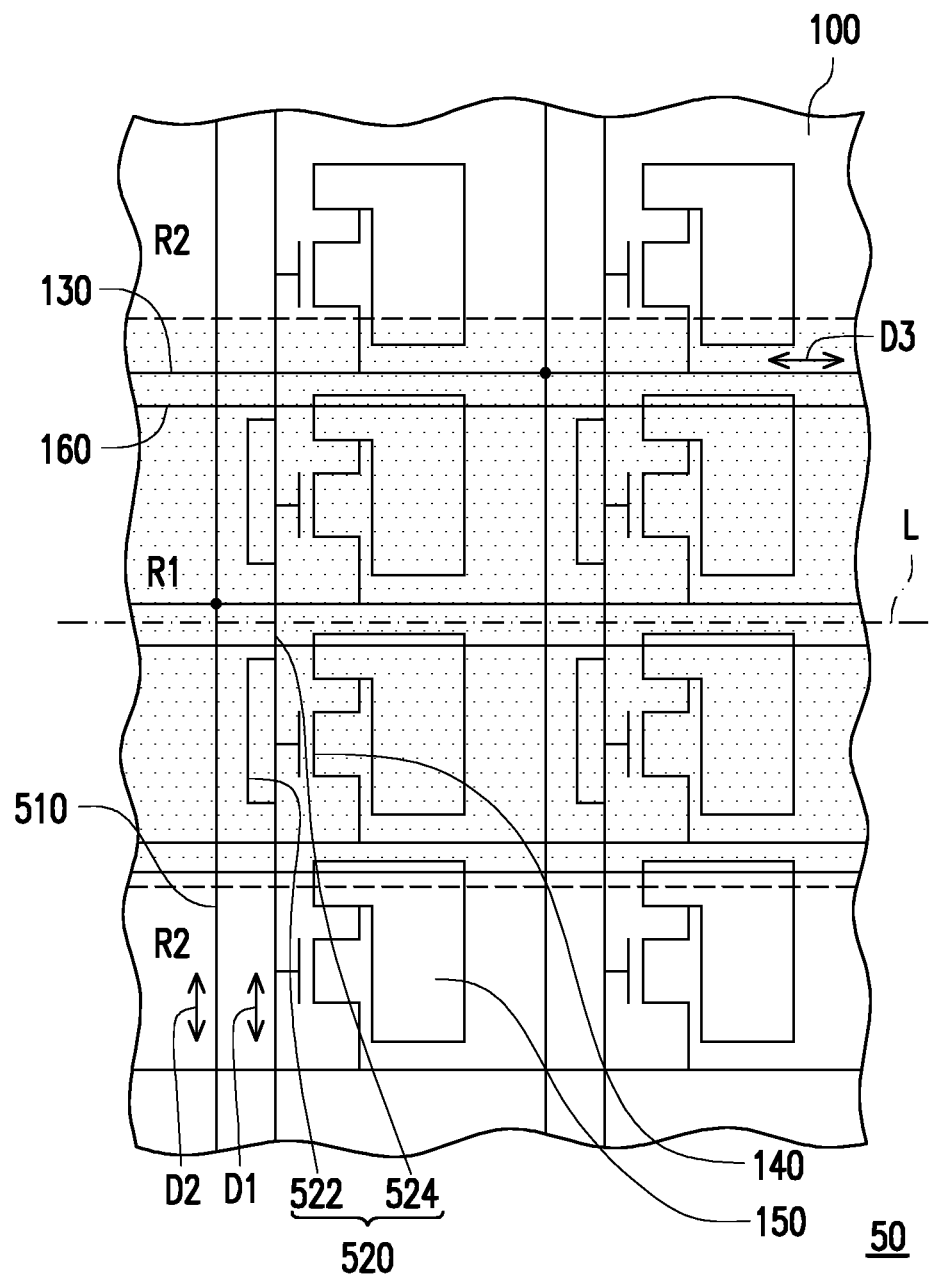
FIG. 7 is a top view of an active device array structure according to, still, another embodiment of the invention.

FIG. 7 is a top view of an active device array structure 50 according to, still, another embodiment of the invention. It should be noted that, the reference numbers and a part of the contents in the previous embodiment are used in the embodiment of FIG. 7, in which identical reference numbers indicate identical or similar components, and repeated description of the same technical contents is omitted. The omitted part of the description can refer to the foregoing embodiments, which are repeated in the following embodiments.

The difference between the active device array structure 50 of FIG. 7 and the active device array structure 10 of FIG. 1 is that, first signal lines 520 and second signal lines 510 in the active device array structure 50 of FIG. 7 are different from the first signal lines 110 and the second signal lines 120 in the active device array structure 10 of FIG. 1.

With reference to FIG. 7, the first signal lines 520 and the second signal lines 510 both cross through the first region R1 and the second region R2. The first signal line 520 includes a plurality of first multi-segments structures 522 and a plurality of single-segment structures 524. The first multi-segments structure 522 is located in the first region R1. The single-segment structure 524 and the first multi-segments structure 522 are alternately connected along the extending direction D1 of the first signal lines 520. The signal lines 510 are electrically independent from the first signal lines 520.

The third signal line 130 is electrically connected to one of the second signal lines 510. The active device 140 is electrically connected to one of the first signal lines 520 and one of the third signal lines 130. In the present embodiment, the gate of the active device 140 is electrically connected to the first signal line 520 and the source of the active device 140 is electrically connected to the third signal line 130, but the invention is not limited thereto. In other embodiments, the source of the active device 140 is electrically connected to the first signal line 520, and the gate of the active device 140 is electrically connected to the third signal line 130. In an embodiment, a number of the second signal lines 510 is equal to a number of the third signal lines 520, but the invention is not limited thereto. In other embodiments, the number of the second signal lines 510 may not be equal to the number of the third signal lines 520.

Based on the above, in the active device array structure 50 of the invention, the first signal line 520 located in the first region R1 includes the first multi-segments structures 522. By utilizing the design of the first multi-segments structures 522, the first signal lines 520 in the first region R1 are not prone to be damaged by bending, and thus the problem of non-uniform impedance generated due to damages of the first signal lines 520 can be solved.

In summary, in the active device array structure according to the invention, the signal lines located in the first region include the multi-segments structures. By utilizing the special design of the multi-segments structures, the signal lines in the first region are not prone to be damaged by bending, and thus the problem of non-uniform impedance generated due to damages of the signal lines can be solved. In an embodiment, because the first signal lines or the second signal lines may be used as a selection line of the scan line or a selection line of the data line, a frame width of the electronic product may be reduced by using the proposed active device array structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array structure, comprising:
 a substrate, having a first region and a second region, wherein a bending degree of the first region is greater than a bending degree of the second region;
 a plurality of first signal lines, disposed on the substrate, wherein each of the first signal lines crosses through the first region and the second region and comprises at least one first multi-segments structure, and the first multi-segments structure is located in the first region and comprises a plurality of first segments electrically connected in parallel;
 a plurality of second signal lines, disposed on the substrate, wherein each of the second signal lines crosses through the first region and the second region and is electrically independent from the first signal lines;

a plurality of third signal lines, disposed on the substrate, wherein an extending direction of the third signal lines is intersected with the first signal lines and the second signal lines and each of the third signal lines is electrically connected and conductive to one of the first signal lines or one of the second signal lines; and a plurality of active devices, disposed on the substrate, wherein each of the active devices is electrically connected to said one of the second signal lines and one of the third signal lines when said each of the third signal lines is electrically connected to said one of the first signal lines, or each of the active devices is electrically connected to said one of the first signal lines and one of the third signal lines when said each of the third signal lines is electrically connected to said one of the second signal lines.

2. The active device array structure as recited in claim 1, wherein the first signal lines transmit a data signal, and the second signal lines transmit a scan signal.

3. The active device array structure as recited in claim 1, wherein the first signal lines transmit a scan signal, and the second signal lines transmit a data signal.

4. The active device array structure as recited in claim 1, wherein each of the first signal lines further comprises at least one single-segment structure, and the single-segment structure and the first multi-segments structure are connected in turn along an extending direction of the first signal lines.

5. The active device array structure as recited in claim 4, wherein the first multi-segments structure comprises N first segments connected in parallel, a line width of the single-segments structure is N times a line width of one of the N first segments, and N is an integer greater than 1.

6. The active device array structure as recited in claim 1, wherein each of the at least one first multi-segments structure is located between adjacent two of the third signal lines.

7. The active device array structure as recited in claim 1, wherein adjacent two of the first segments of each of the at least one first multi-segments structure are separated by an opening.

8. The active device array structure as recited in claim 7, wherein a shape of the opening comprises a rectangle or a rhombus.

9. The active device array structure as recited in claim 1, wherein at least one of the second signal lines comprises at least one second multi-segments structure, and the second multi-segments structure is located in the first region and comprises a plurality of second segments connected in parallel.

10. The active device array structure as recited in claim 9, wherein the at least one of the second signal line further comprises at least one single-segment structure, and the single-segment structure and the second multi-segments structure are connected in turn along an extending direction of the at least one second signal line.

11. The active device array structure as recited in claim 10, wherein the second multi-segments structure comprises N second segments connected in parallel, a line width of the single-segment structure is N times a line width of one of the N second segments, and N is an integer greater than 1.

12. The active device array structure as recited in claim 1, wherein the first region is adapted to be bent along a bending axis, and an intersection angle between an extending direction of the first signal lines and the second signal lines and the bending axis is greater than an intersection angle between the extending direction of the third signal lines and the bending axis.

13. The active device array structure as recited in claim 1, wherein the first region of the substrate is bendable, and the second region of the substrate is substantially flat.

* * * * *